United States Patent [19]

Black

[11] Patent Number: 5,896,261
[45] Date of Patent: Apr. 20, 1999

[54] POWER DOWN PROTECTION CIRCUIT FOR AN ELECTRONIC DEVICE

[75] Inventor: Gregory Redmond Black, Vernon Hills, Ill.

[73] Assignee: Motorola, Inc., Schaumburg, Ill.

[21] Appl. No.: 08/977,731

[22] Filed: Nov. 25, 1997

[51] Int. Cl.$^6$ ...................................................... H02H 3/24
[52] U.S. Cl. ........................................... 361/92; 361/18
[58] Field of Search ......................... 361/92, 93, 18, 361/56, 86; 307/125, 126, 130, 131, 140, 150; 323/220–303, 292; 324/522, 426, 429, 433; 320/136; 330/267, 285, 296–298, 307

[56] References Cited

U.S. PATENT DOCUMENTS

| | | | |
|---|---|---|---|
| 4,709,404 | 11/1987 | Tamura et al. | 455/73 |
| 5,136,246 | 8/1992 | Sakamoto | 324/433 |
| 5,179,337 | 1/1993 | Staarman et al. | 320/13 |
| 5,278,994 | 1/1994 | Black et al. | |
| 5,606,285 | 2/1997 | Wang et al. | 330/134 |

*Primary Examiner*—Jeffrey Gaffin
*Assistant Examiner*—Kim Huynh
*Attorney, Agent, or Firm*—Mark D. Patrick

[57] ABSTRACT

An electronic device (102) includes a power supply (114), an amplifier circuit (132), and a power down protection circuit (160). The power supply (114) supplies power to the electronic device (102). The amplifier circuit (132) is powered by the power supply (114) to amplify a signal into an amplified output signal and controllable to vary a power level of the amplified output signal. The power down protection circuit (160) is coupled directly to the power supply (114) to lower the power level of the amplified output signal of the amplifier circuit (132) when the power supply (114) falls below a threshold.

19 Claims, 1 Drawing Sheet

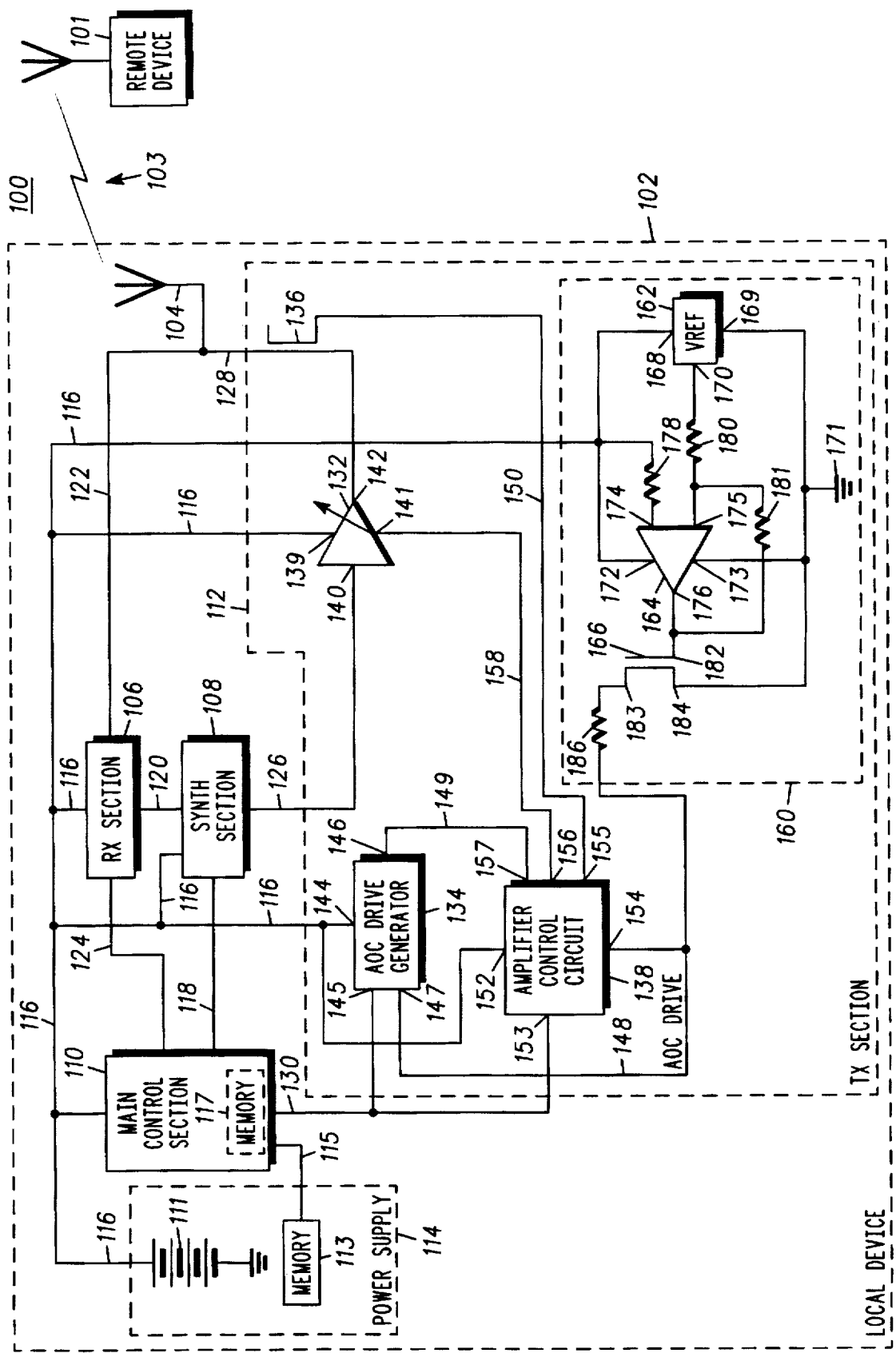

5,896,261

POWER DOWN PROTECTION CIRCUIT FOR AN ELECTRONIC DEVICE

FIELD OF THE INVENTION

The present invention relates generally to electronic devices and, more particularly, to a power down protection circuit for an electronic device.

BACKGROUND OF THE INVENTION

Electronic devices, such as wireless communication devices, have become increasingly popular due, in part, to their portability. Portability is accomplished by equipping the device with a battery. The battery, prior to depletion, supplies power to operate components of the device. Once the voltage of the battery depletes to a low battery threshold below which the components can only operate for a short time, the device initiates a controlled power down.

Most electronic devices have circuitry configured such that without a controlled power down operation, the device continues to operate until the voltage level of the battery reaches a power-on reset (POR) threshold at which the device immediately, and without warning, turns off. Such power down that is immediate and without warning can be problematic if critical operational processes are left incomplete, such as the establishment of communication with a remote device or the internal execution of a function that must be brought to completion once started, such as data storage operations. Also, in such situations, the user of the device will be given no warning that the device will be turned off.

One component of the device that is powered by the battery is a power amplifier. In operation, the power amplifier amplifies signals to an output level sufficient for over the air transmission. During operation, the power amplifier may enter a saturation state in which it cannot amplify signals to the output level demanded of it by the control circuitry of the device. While saturated, the power amplifier draws excessive current from the battery in an attempt to meet the demands of the control circuitry. In circumstances where the power amplifier is saturated while the battery voltage is low, the excessive current drain of the power amplifier can cause the battery to fully deplete before the controlled power down can be executed or cause the controlled power down to be executed prematurely.

One existing way to minimize rapid battery depletion is described in U.S. Pat. No. 5,278,994 by Black et al., entitled "Power Amplifier Saturation Detection and Correction Method and Apparatus," issued on Jan. 11, 1994, and assigned to Motorola, Inc. In U.S. Pat. No. 5,278,994, the output level of the power amplifier is decreased whenever saturation is detected. In one embodiment, saturation is detected by sensing a slow-down of the control loop response. Once detected, the output level is reduced by an amount based on the level of saturation, which is determined from the loop response time. Because loop response time is not perfectly correlated with the level of saturation, there is a need to slightly over-correct the power level in order to reliably predict depletion of the battery. Such over-correction compromises power amplifier performance.

Although U.S. Pat. No. 5,278,994 provides one way to minimize rapid battery depletion, it would be beneficial to be able to maximize amplifier performance and to ensure that the controlled power down is always executed.

BRIEF DESCRIPTION OF THE DRAWING

The FIGURE is a partial block diagram and partial schematic diagram of a wireless communication system including an electronic device employing a power down protection circuit.

DETAILED DESCRIPTION OF THE PREFERRED EMBODIMENTS

An electronic device includes a power supply, an amplifier circuit, and a power down protection circuit. The power supply supplies power to the electronic device. The amplifier circuit is powered by the power supply to amplify an input signal and generate an amplified output signal, and is controllable to vary a power level of the amplified output signal. The power down protection circuit is coupled directly to the power supply to lower the power level of the amplified output signal of the amplifier circuit when the power supply falls below a threshold. By controlling the amplifier circuit based on the power supply, loss of amplifier performance from saturation over-correction can be avoided and the electronic device can always be powered down in a controlled fashion.

A communication system 100, shown in the FIGURE, comprises remote and local electronic devices 101 and 102 that communicate via a communication link 103. In the illustrated embodiment, the remote and local devices 101 and 102 are a base station and a wireless communication device, respectively, and the link 103 comprises communication signals, such as radio frequency (RF) signals. The local device 102 includes an antenna 104, a receive section 106, a synthesizer section 108, a main control section 110, a transmit section 112, and a power supply 114. The power supply 114 includes one or more depletable batteries 111 and a memory 113. The batteries 111 provide power to the sections 106, 108, 110, and 112 via the connection 116. The memory 113 contains power supply information and is coupled to the main control section 110 via connection 115. The power supply 114 is a 3.6 V, 500 mΩ, 500 mA-hour supply, or other suitable alternative.

In operation, the local device 102 consumes the power provided by the power supply 114. The main control section 110 controls the operation of the local device 102 according to operational instructions stored in memory 117. The main control section 110, in accordance with the instructions, communicates tuning and transmit information to the synthesizer section 108 via connection 118. The synthesizer section 108, responsive to the tuning information, tunes the receive section 106 via connection 120 to receive the RF signals of the link 103 via the antenna 104 and connection 122. The receive section 106 converts the RF signals into receive data and audio signals, which are coupled to the main control section 110 for processing via connection 124. The synthesizer section 108, responsive to the transmit information that can include transmit data and audio signals, converts the transmit information into RF signals and couples the RF signals to the transmit section 112 via connection 126. The transmit section 112 amplifies the RF signals and outputs the amplified signal on connection 128 for emission by the antenna 104. The local device 102 operates in this manner until the power supply 114 nears depletion. In the illustrated embodiment, operation of the local device 102 depletes the power supply 114 at a rate of approximately 250 mA.

During operation of the local device 102, the main control section 110 manages depletion of the power supply 114 according to power supply thresholds stored in the memory 113 and power management instructions stored in memory 117. In accordance with the power management instructions, the main control section 110 monitors the depletion of the power supply 114 via connection 116. The main control section 110 detects a voltage level of the power supply 114 and compares the voltage level to a low battery threshold or power down threshold. The power down threshold is stored in memory 113 of the power supply 114 and defines a voltage level below which the sections 106, 108, and 112 can only operate for a limited amount of time. When the voltage of the power supply 114 falls below the power down threshold and remains there for a predetermined time period (which is stored in memory 117), the main control section 110 initiates, according to the power management instructions, a controlled power down of the sections 106, 108, and 112 by communicating power down signals via connections 124, 118, and 130, respectively. In the illustrated embodiment, the power down threshold for a 3.6 V, 500 mΩ, 500 mA-hour supply is approximately 2.85 V, the predetermined time period is approximately 35 ms, and the time it takes to execute the controlled power down is approximately 800 ms.

During operation of the local device 102, the power supply 114 is most susceptible to depletion by the transmit section 112 and, in particular, by an amplifier circuit 132 of the transmit section 112. The amplifier circuit 132 includes ports 139–142. Port 139 is a supply input and is coupled to connection 116 to receive power from the power supply 114. Port 140 is an RF signal input and is coupled to connection 126 to receive an RF input signal for amplification. Port 141 is a control port. Port 142 is an RF signal output and is coupled to connection 128 to provide an amplified RF output signal to the antenna 104. In operation, the amplifier circuit 132 amplifies the RF input signal at port 140 into the amplified RF output signal at port 142. A power level of the amplified RF output signal is set by the amplification level of the amplifier circuit 132, which is controllably varied by a control signal received at port 141. In the illustrated embodiment, the amplifier circuit 132 is a GSM (Global Standard for Mobile Communication) Class 2 type RF amplifier with 60 percent efficiency and having a controllable amplification range from 1 mW to 4 W. Although shown to have a single stage in the FIGURE, one skilled in the art will recognize that the amplifier circuit 132 can alternatively be a multistage amplifier, such as that having the exciter stage 205 and the power amplifier stage 203 shown and described in U.S. Pat. No. 5,278,994 cited above.

The amplifier circuit 132 is controlled by a control loop made up of an automatic output control (AOC) drive generator 134, a coupler 136, and an amplifier control circuit 138. The AOC drive generator 134 includes ports 144–146. Port 144 is a supply input and is coupled to connection 116 to receive power from the power supply 114. Port 145 is a data input and is coupled to connection 130 to receive control data from the main control section 110. The control data includes, for example, power level information, offset information, saturation step down size, and amplifier control start/stop information. Port 146 is a signal input and is coupled to connection 149 to receive a saturation detection signal. Port 147 is a signal output and is coupled to connection 148. The AOC drive generator 134 includes a digital signal processor (DSP) and an analog-to-digital converter (D/A), such as the DSP 223 and the D/A 221 shown and described U.S. Pat. No. 5,278,994 cited above, or other suitable alternative hardware implementation. In operation, the AOC drive generator 134, in response to the data received at port 145 and the saturation detection signal received at port 146, generates the AOC drive signal AOC DRIVE on connection 148 via port 147. The format of the AOC drive signal AOC DRIVE varies according to the type of the communication system 100. In a GSM system, for example, the AOC drive signal AOC DRIVE can be modeled from segments of a raised cosine waveform.

The coupler 136 is directional with one end electromagnetically coupled to connection 128 at port 142 of the amplifier circuit 132 and the other end coupled to the amplifier control circuit 138 via connection 150. In operation, the coupler 136 couples the power level of the amplified RF output signal to the amplifier control circuit 138 without excessive loss.

The amplifier control circuit 138 includes ports 152–157. Port 152 is a supply input and is coupled to connection 116 to receive power from the power supply 114. Port 153 is a data input and is coupled to connection 130 to receive the control data from the main control section 110. Port 154 is a signal input and is coupled to connection 148 to receive the AOC drive signal AOC DRIVE. Port 155 is a signal input and is coupled to connection 150 to receive the fedback power level of the amplified RF output signal from the coupler 136. Port 156 is a signal output and is coupled to port 141 of the amplifier circuit 132 via connection 158. Port 157 is a signal output and is coupled to connection 149. The amplifier control circuit 138 includes detector and comparator circuitry arranged and interconnected according to the saturation detection and control loop shown and described in U.S. Pat. No. 5,278,994 cited above.

In operation, the amplifier control circuit 138, responsive to receiving the amplifier control start signal at port 153, outputs, at port 156, the AOC drive signal AOC DRIVE received at port 154 so as to set the power level of the amplified output signal of the amplifier circuit 132. The amplifier control circuit 138 also compares the AOC drive signal AOC DRIVE to the fedback power level of the amplified RF output signal received at port 155 to determine if the amplifier circuit 132 is in saturation. If the amplifier circuit 132 is in saturation, the amplifier control circuit 138 outputs the saturation detection signal, which has a magnitude corresponding to the level of saturation, at port 157 so as to allow the AOC drive generator to, if desired, back off the AOC drive signal AOC DRIVE and remove the amplifier circuit 132 from saturation.

As previously described, the use of saturation detection and over-correction to minimize consumption of the power supply 114 sacrifices performance of the amplifier circuit 132. Rather than relying on such over-correction, the transmit section 112 of the local device 102 employs a power down protection circuit 160 to minimize rapid depletion of the power supply 114, ensure execution of the controlled power down by the main control section 110, and optimizes amplifier performance. The power down protection circuit includes a voltage reference 162, a comparator 164, and a switch 166.

The voltage reference 162 includes ports 168–170. Port 168 is a supply input and is coupled to connection 116 to receive power from the power supply 114. Port 169 is a ground input and is coupled to an electrical ground 171. Port 170 is a voltage output. In operation, the voltage reference 162, which is preferably comprised of a temperature stable band-gap voltage generator or other suitable device, outputs a reference voltage level at port 170. In the illustrated embodiment, the reference voltage level is approximately 2.8 V.

The comparator 164 includes ports 172–176. Port 172 is a supply input and is coupled to connection 116 to receive power from the power supply 114. Port 173 is a ground input and is coupled to the electrical ground 171. Port 174 is voltage input and is coupled to connection 116 via a resistive element 178 so as to receive a voltage level of the power supply 114. Resistive element 178 provides a voltage drop necessary to match the power supply 114 to port 174 and is preferably a resistor having a value of approximately 10 kΩ, or other suitable alternative. Port 175 is voltage input and is coupled to port 170 of the voltage reference 162 via a resistive element 180. Resistive element 180 provides a voltage drop necessary to match the reference voltage level supplied by the voltage reference 162 to port 175 and is preferably a resistor having a value of approximately 11 kΩ, or other suitable alternative. Port 176 is a signal output and is coupled to port 175 via a resistive element 181. Resistive element 181 sets a level of hysteresis to prevent rapid transitioning between signal output levels at port 176 and is preferably a resistor having a value of approximately 100 kΩ, or other suitable alternative. In the illustrated embodiment, the comparator 164 is an analog comparator or suitable alternative. In operation, the comparator 164 compares the voltage levels received at ports 174 and 175. When the voltage level at port 174 equals or exceeds the reference voltage level at port 175, the comparator 164 generates a low voltage output signal at port 176. When the voltage level at port 174 falls below the reference voltage level at port 175, the comparator 164 generates a high voltage output signal at port 176.

The switch 166 includes ports 182-184. Port 182 is a control input and is coupled to port 176 of the comparator 164 to receive the low or high voltage output signal. Port 183 is coupled to port 147 of the AOC drive generator 134 via connection 148 and port 154 of the amplifier control circuit 138 via resistive element 186. Resistive element 186 determines the amount of attenuation on the AOC drive signal AOC DRIVE and is preferably a resistor having a value of approximately 10 kΩ, or other suitable alternative. Port 184 is coupled to the electrical ground 171. In operation, the switch 166, responsive to the low or high voltage output signal at port 182, remains off to disconnect ports 183 and 184 or turns on to connect ports 183 and 184 by providing a conduction path therebetween, respectively. Resistive element 181 ensures that a threshold at which the switch 166 turns on is lower than a threshold at which the switch 166 turns off so as to prevent rapid on/off transitioning. In the illustrated embodiment, the switch 166 is a transistor switch, such as a switching FET (field effect transistor) wherein ports 182-184 are a gate, a drain, and a source, respectively, or other suitable switch.

In operation, the power down protection circuit 160 prevents the power supply 114 from becoming depleted by the amplifier circuit 132 before the controlled power down can be administered by the main control section 110. The power down protection circuit 160 lowers the power level of the amplified RF output signal of the amplifier circuit 132 when the power supply 114 falls below the threshold defined by the voltage reference 162. In particular, when the comparator 164 determines that the voltage level of the power supply 114 falls below the reference voltage level of the voltage reference 162, the switch 166 turns on coupling connection 148 and port 154 of the amplifier control circuit 138 to the electrical ground 171. This attenuates the AOC drive signal AOC DRIVE and lowers the level of amplification of, or mutes, the amplifier circuit 132. The current drain of the amplifier circuit 132 is reduced and the depletion of the power supply 114 is slowed. This ensures that the controlled power down can occur and a user can be given sufficient warning, such as via an audible alert, that the local device 102 is powering down.

The power down protection circuit 160 also optimizes performance of the amplifier circuit 132. The reference voltage level of the voltage reference 162 of the power down protection circuit 160 is set below the power down threshold at which the main control section 110 performs the controlled power down. Also, the comparator 164 of the power down protection circuit 160 drives the switch 166 to attenuate the AOC drive signal AOC DRIVE and mute the amplifier circuit 132 at the instant that the voltage level of the power supply 114 falls below the reference voltage level. This power down protection arrangement ensures that, in a worst case depletion scenario, the power supply 114 would be held from fully depleting at least until the voltage level of the power supply 114 has remained below the power down threshold for the predetermined time period and for the time it takes to execute the controlled power down. The arrangement only mutes the amplifier circuit 132 during such transient conditions where excessive loading on the power supply 114 occurs and the local device 102 is in danger of powering down in an uncontrolled manner. As a result, the power down protection circuit 160 ensures that performance of the amplifier circuit 132 is not unnecessarily compromised.

While particular embodiments of the present invention have been shown, described, and preferred, modifications may be made. For example, the power down protection circuit 160 could alternately utilize a microprocessor and a memory containing multiple reference voltage level values so as to ensure accurate power down protection when the local device 102 is compatible with batteries of many different types and/or capacities. Although shown and described to be incorporated into a wireless communication device, it will be recognized that the power down protection circuit 160 may also be beneficially used in other electronic devices, including but not limited to, pagers, laptop computers, personal digital assistants, cordless telephones, and the like. It is therefore intended in the appended claims to cover all such changes and modifications which fall within the true spirit and scope of the invention.

What is claimed is:

1. An electronic device comprising:

a power supply to supply power to the electronic device;

an amplifier circuit coupled to the power supply, the amplifier circuit powered by the power supply to amplify a signal into an amplified output signal, the amplifier circuit controllable to vary a power level of the amplified output signal;

an automatic output control (AOC) drive generator having an output, the AOC drive generator to generate an AOC drive signal at the output of the AOC drive generator to set the power level of the amplified output signal of the amplifier circuit; and a power down protection circuit coupled to the power supply, the power down protection circuit to lower the power level of the amplified output signal of the amplifier circuit when the power supply falls below a threshold, the power down protection circuit comprising:

an electrical ground;

a voltage reference coupled to the power supply, the voltage reference having a reference voltage level indicative of the threshold;

a comparator having a first input, a second input, and an output, the first input coupled to the power supply, the second input coupled to the voltage reference; and a switch coupled to the output of the AOC drive generator, the switch selectable to attenuate the AOC drive signal when the power supply falls below the threshold, the switch comprising a transistor switch, the transistor switch having first, second, and third ports, the first port coupled to the output of the comparator, the second port coupled to the output of the AOC drive generator, the third port coupled to the electrical ground.

2. An electronic device according to claim 1 further comprising an amplifier control circuit having a first input and an output, the first input of the amplifier control circuit coupled to the output of the AOC drive generator and the second port of the switch, the output of the amplifier control circuit coupled to the amplifier circuit.

3. An electronic device according to claim 2 further comprising a coupler having one end coupled to an output of the amplifier circuit and the other end coupled to a second input of the amplifier control circuit, the coupler to couple the power level of the amplified output signal to the amplifier control circuit.

4. An electronic device according to claim 1 further comprising:
at least one of a receive section, synthesizer section and a transmit section coupled to the power supply and powered thereby; and
a main control section coupled to the power supply and the at least one of a receive section, synthesizer section and a transmit section, the main control section, responsive to detection of the power supply below a second threshold, to control the at least one of a receive section, synthesizer section and a transmit section to power down.

5. An electronic device according to claim 4 wherein
the main control section comprises a first memory, the first memory containing power management instructions; and
the power supply comprises a second memory, the second memory containing power supply thresholds.

6. An electronic device according to claim 1
wherein the threshold of the power down protection circuit is a first threshold and the power down protection circuit lowers the power level of the amplified output signal of the amplifier circuit when the power supply falls below the first threshold for a first period of time; and
further comprising a power down arrangement coupled to the power supply, the power down arrangement to controllably power down the electronic device when the power supply is below a second threshold for a second period of time.

7. An electronic device according to claim 6 wherein the second threshold is greater than the first threshold and the second period of time is greater than the first period of time.

8. An electronic device according to claim 1 wherein the electronic device is a wireless communication device, and the amplifier circuit is a GSM Class 2 type RF amplifier.

9. An electronic device comprising:
a power supply to supply power to the electronic device;
an amplifier circuit coupled to the power supply, the amplifier circuit powered by the power supply to amplify a signal into an amplified output signal, the amplifier circuit controllable to vary a power level of the amplified output signal;
an automatic output control (AOC) drive generator having an output, the AOC drive generator to generate an AOC drive signal at the output of the AOC drive generator to set the power level of the amplified output signal of the amplifier circuit;
a power down protection circuit coupled to the power supply, the power down protection circuit to lower the power level of the amplified output signal of the amplifier circuit when the power supply falls below a threshold; and
an amplifier control circuit having a first input and an output, the first input of the amplifier control circuit coupled to the output of the AOC drive generator and the power down protection circuit, the output of the amplifier control circuit coupled to the amplifier circuit.

10. An electronic device according to claim 9 further comprising a coupler having one end coupled to an output of the amplifier circuit and the other end coupled to a second input of the amplifier control circuit, the coupler to couple the power level of the amplified output signal to the amplifier control circuit.

11. An electronic device according to claim 9 wherein the power down protection circuit comprises a comparator to compare a voltage level of the power supply and a reference voltage level indicative of the threshold.

12. An electronic device according to claim 9 further comprising:
at least one of a receive section, synthesizer section and a transmit section coupled to the power supply and powered thereby; and
a main control section coupled to the power supply and the at least one of a receive section, synthesizer section and a transmit section, the main control section, responsive to detection of the power supply below a second threshold, to control the at least one of a receive section, synthesizer section and a transmit section to power down.

13. An electronic device according to claim 12 wherein
the main control section comprises a first memory, the first memory containing power management instructions; and
the power supply comprises a second memory, the second memory containing power supply thresholds.

14. An electronic device according to claim 6
wherein the threshold of the power down protection circuit is a first threshold and the power down protection circuit lowers the power level of the amplified output signal of the amplifier circuit when the power supply falls below the first threshold for a first period of time; and
further comprising a power down arrangement coupled to the power supply, the power down arrangement to controllably power down the electronic device when the power supply is below a second threshold for a second period of time.

15. An electronic device according to claim 14 wherein the second threshold is greater than the first threshold and the second period of time is greater than the first period of time.

16. An electronic device according to claim 9 wherein the power down protection circuit comprises a switch coupled to the output of the AOC drive generator, the switch selectable to attenuate the AOC drive signal when the power supply falls below the threshold.

17. An electronic device according to claim 16 wherein the power down protection circuit further comprises:
a voltage reference coupled to the power supply, the voltage reference having a reference voltage level indicative of the threshold; and a comparator having a first input, a second input, and an output, the first input coupled to the power supply, the second input coupled to the voltage reference, the output of the comparator coupled to the switch.

18. An electronic device according to claim 17 wherein the power down protection circuit further comprises:

a voltage reference coupled to the power supply, the voltage reference having a reference voltage level indicative of the threshold; and a comparator having a first input, a second input, and an output, the first input coupled to the power supply, the second input coupled to the voltage reference, the output of the comparator coupled to the switch.

19. An electronic device according to claim 9 wherein the electronic device is a wireless communication device, and the amplifier circuit is a GSM (Global Standard for Mobile Communication) Class 2 type RF (radio frequency) amplifier.

* * * * *